(12) United States Patent
Wu

(10) Patent No.: US 6,532,141 B1
(45) Date of Patent: Mar. 11, 2003

(54) HEAT-DISSIPATING DEVICE FOR ELECTRONIC COMPONENT

(75) Inventor: Yaz-Tzung Wu, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 10/021,017

(22) Filed: Dec. 19, 2001

(51) Int. Cl.7 .................................................. H02H 3/42
(52) U.S. Cl. ...................................... 361/80.3; 361/80.4
(58) Field of Search ............................... 165/80.3, 80.4, 165/104.33; 174/15.1; 257/714–715, 722; 361/687, 698–703
(58) Field of Search ........................................................

(56) References Cited

U.S. PATENT DOCUMENTS 6,382,307 B1 * 5/2002 Wang et al. ................ 165/80.3

* cited by examiner

*Primary Examiner*—Gregory Thompson
(74) *Attorney, Agent, or Firm*—Rothwell, Figg, Ernst & Manbeck

(57) ABSTRACT

A heat-dissipating device for an electronic component is proposed, including a main body, at least a heat pipe and at least a heat-dissipating block. The heat-dissipating block detachably coupled to the heat pipe is used to increase the heat transfer area, allowing heat generated from the electronic component to be transferred through the heat pipe to the heat-dissipating block for effective dissipation to outside of the electronic component.

11 Claims, 4 Drawing Sheets

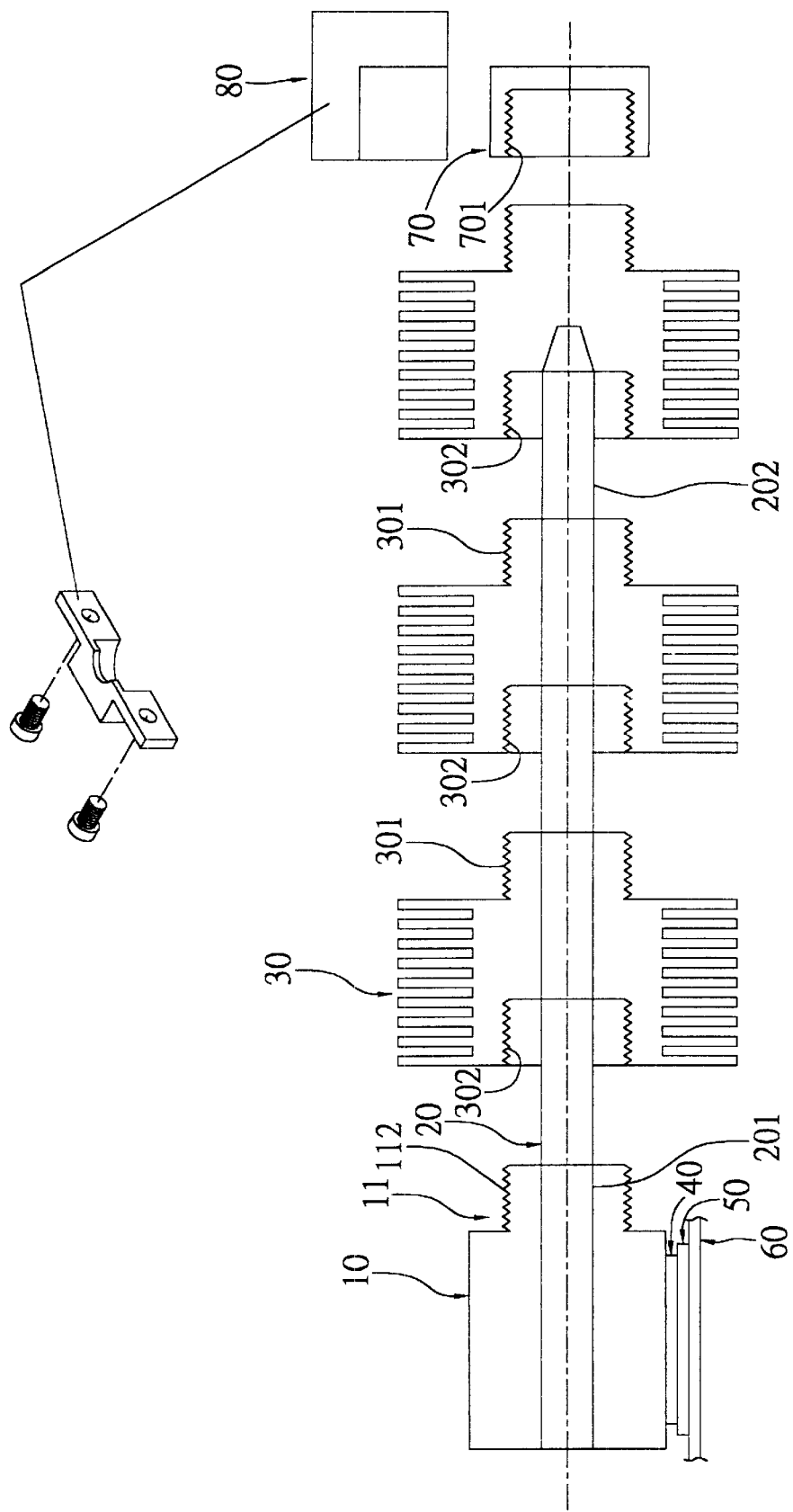

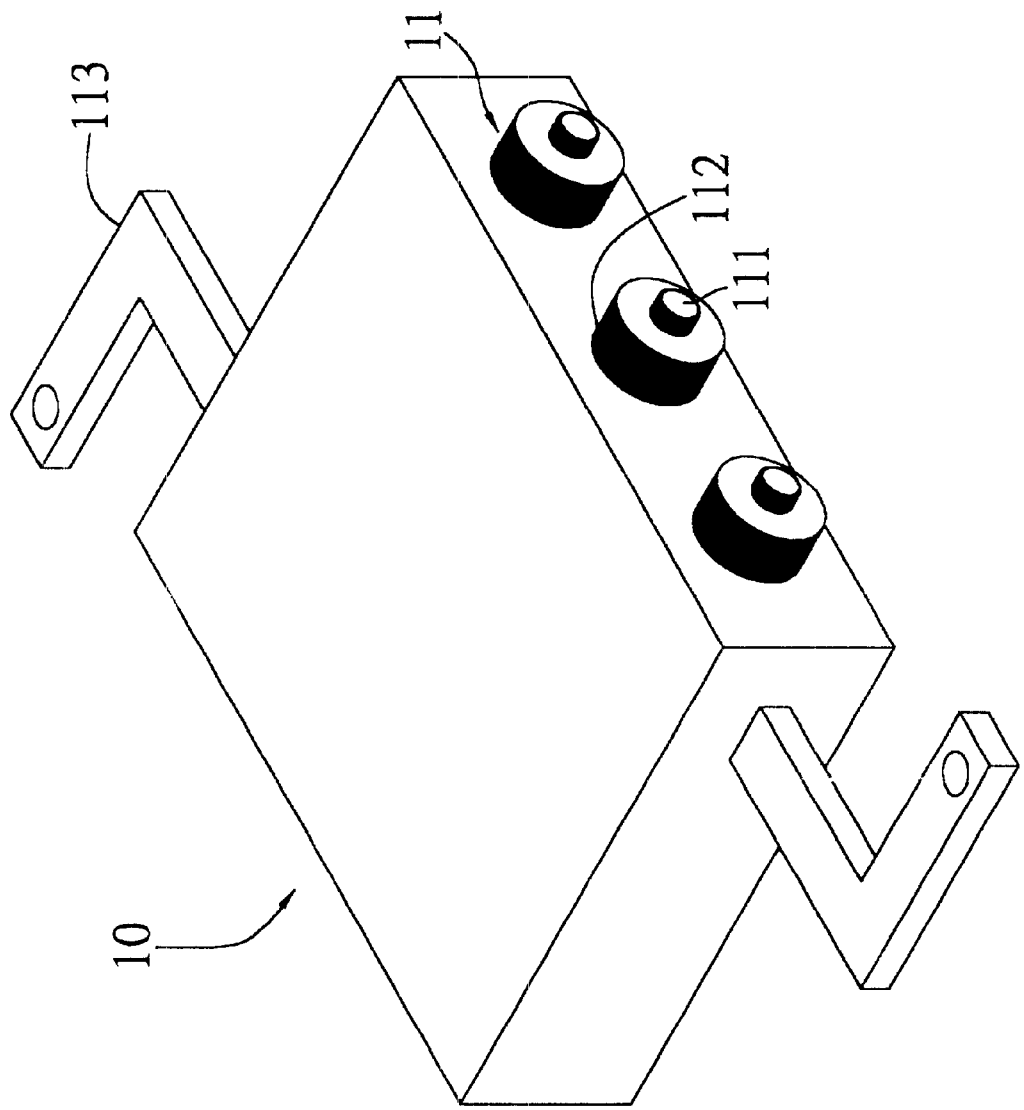

HEAT-DISSIPATING DEVICE FOR ELECTRONIC COMPONENT

FIELD OF THE INVENTION

The present invention relates to heat-dissipating devices for electronic components, and more particularly, to a heat-dissipating device for use with an electronic component for dissipating heat generated by the electronic component.

BACKGROUND OF THE INVENTION

Current electronic components, such as CPUs or semiconductor packages used in computers or servers, have a high manipulation speed. Thus, when the electronic component is executed under full load, the temperature of its surface will be rather high even up to above 100° C. In order to dissipate heat generated by the electronic component, various heat dissipation modules, such as fans or coolers, are mounted with the electronic components for dissipating the heat generated from the electronic components, so as to prevent the electronic components from being damaged due to overheat.

However, the technology of making electronic components is advanced very rapidly. A more advanced electronic component can be developed within a short period of time. Since the advanced electronic components usually produce a greater amount of heat, the original module for heat dissipation will be insufficient to efficiently dissipate the heat generated from the electronic components. Thus, it is usually required to design a new module to solve the heat dissipation problem. However, provision of a new heat dissipation module always brings additional research and manufacturing costs for the manufacturers. As to the customers, when the electronic components of their computers or network servers which use the original modules are to be upgraded, the overheat problem, which results in the component damage or life span reduction, will still be encountered. At the same time, since electronic devices are developed toward a miniaturization trend, the space for accommodating the motherboard on which electronic components are mounted and the heat dissipation modules will thus become more limited than before. Therefore, it is quite important to develop a flexible module that can increase heat transfer capacity immediately without compromising the high speed requirement for an advanced electronic component, and can thus eliminate the need of making a new heat dissipation module for coping with increased heat dissipation concern when the upgrade of the electronic component is required.

SUMMARY OF THE INVENTION

In order to solve the above-mentioned problems, a primary objective of the present invention is to provide a heat-dissipating device for an electronic component, that can fit various heat dissipation requirements, allowing the manufacturing cost for the heat-dissipating device to be reduced.

Another objective of the invention is to provide a heat-dissipating device for an electronic component, that is attachable one with another and is convenient in assembly.

A further objective of the invention is to provide a heat-dissipating device for an electronic component, that can increase the heat transfer area and the heat dissipation efficiency simply by increasing the number of the heat-dissipating devices that are attached one with another.

A still further objective of the invention is to provide a heat-dissipating device for an electronic component, that is simple in structure and can be easily mounted with the electronic component.

In order to achieve the above and other objectives, a heat-dissipating device for an electronic component is proposed by the present invention, which comprises: a main body adapted to be mounted on an electronic component, the main body being formed with at least a joining portion; at least a heat pipe detachably coupled to the joining portion in a manner that, at least a portion of the heat pipe is exposed to the exterior of the main body; and at least a heat-dissipating block detachably coupled to the exposed portion of the heat pipe, whereby the heat generated from the electronic component can be transferred via the main body and the heat pipe to the heat-dissipating block.

The joining portion of the main body is configured as a short cylinder, and formed with a central bore that extends into the main body, with a connecting portion provide at a periphery of the short cylinder and surrounding the central bore.

The heat pipe is configured as an elongated tube, one end of which is inserted into the main body through the central bore of the joining portion, whereas the other end of the heat pipe is exposed to outside of the main body, for being fitted with a plurality of the heat-dissipating blocks, so as to allow the heat generated from the electronic component to be rapidly transferred through the heat pipe to the heat-dissipating block for dissipation.

The heat-dissipating block is a tubular body formed at a periphery thereof with a plurality of heat sinks. One end of the tubular body is provided with a first connecting portion, and the other end thereof is formed with a second connecting portion. A plurality of the heat-dissipating blocks can be in series coupled to the heat pipe in a manner that, a first connecting portion of a heat-dissipating block is joined with a second connecting portion of another adjacent heat-dissipating block, so as to increase the heat transfer area for allowing better performances of heat dissipation.

Further, the heat sinks formed on the heat-dissipating block are not limited to particular shape, number and extension direction as shown in the drawing. For example, the heat sinks can be configured as fin or radiating shape, as long as the configuration is capable of enlarging the heat transfer area as desired in the invention.

The connection between adjacent heat-dissipating blocks can be achieved by adopting any conventional connection means; nevertheless, it is preferred that the heat-dissipating blocks are attached to each other by means of threads, so as to optimize heat transfer area and heat dissipation efficiency.

Moreover, among the heat-dissipating blocks coupled to the heat pipe, a heat-dissipating block positioned closest to the main body has its second connecting portion threadedly joined with the connecting portion of the main body; whereas a heat-dissipating block located farthest from the main body has its first connecting portion threadedly engaged with a threaded portion of a nut. The nut is then fixed by using a shoe, so as to firmly hold the heat-dissipating blocks coupled to the heat pipe in position.

The number of the joining portion formed on the main body is not limited to one, but can be more as necessary. Also, the length and number of the heat pipe, and the number of the heat-dissipating block coupled to the heat piper, are not particularly restricted. Besides straight tube structure, the heat pipe can be designed in other shapes, for example, a tube bent by 45, 90 or other degrees. It is understood that, the foregoing elements can be flexible in arrangement and design so as to be properly incorporated with a computer or server, and to optimize the effectiveness of heat dissipation.

Furthermore, the central bore of the joining portion can be made to penetrate the main body, allowing the heat pipe, that is inserted into the main body through the central bore, to expose its both ends to the exterior of the main body, so as to provide more flexibility of element arrangement on a motherboard.

Alternatively, besides insertion of the heat pipe into the main body, the heat pipe can be integrally formed with the main body at one side or two opposite sides of the main body. In combination of any arrangement and design of the main body incorporated with the heat pipe, the heat-dissipating device of the invention can be suitably applied to various electronic components, especially to a computer or server demanding for high efficacy of heat dissipation.

BRIEF DESCRIPTION OF THE DRAWINGS

The present invention can be more fully understood by reading the following detailed description of the preferred embodiments with reference made to the accompanying drawings, wherein:

FIG. 1 is a cross-sectional view of a heat-dissipating device of a preferred embodiment of the invention;

FIG. 2 is a perspective view of a main body of the invention;

DETAILED DESCRIPTION OF THE PREFERRED EMBODIMENTS

Figure 4:
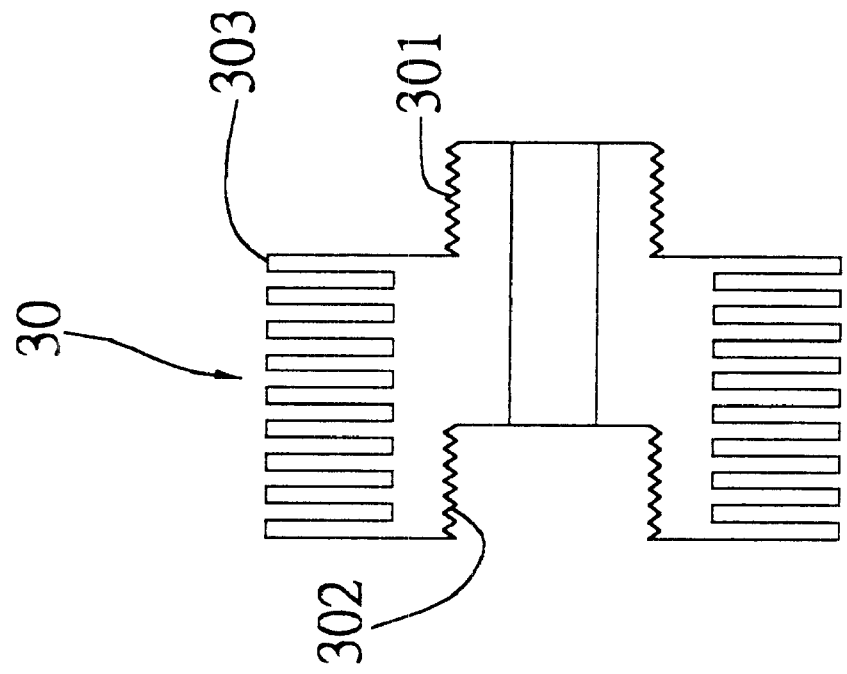
FIG. 4 is a cross-sectional view of a heat-dissipating block of the first invention.

Referring to FIGS. 1 and 2, a heat-dissipating device for an electronic component of the invention is composed of a main body 10, a heat pipe 20 and three heat-dissipating blocks 30. It is understood that, the number of the heat-dissipating block 30 is not limited to that illustrated in the drawing, but can be varied according to practical usage. The main body 10 is adapted to be mounted on an electronic component 50, such as a CUP of a computer, via a thermally-conductive adhesive 40 for facilitating the transfer of the heat generated from the electronic component 50. A joining portion 11 is provided on one of the lateral sides of the main body 10, and consists of a central bore 111 surrounded by a connecting portion 112. Additionally, the main body 10 is provided with legs 113 for affixing the main body 10 onto a motherboard 60. A first end 201 of the heat pipe 20 is inserted into the main body 10 through the central bore 111 of the joining portion 11; a second end 202 of the heat pipe 20 is exposed to the exterior of the main body 10, for transferring the heat generated from the electronic component 50. The heat-dissipating block 30 is coupled to the exposed second end 202 of the heat pipe 20. This allows the heat generated from the electronic component 50 to be transferred via the main body 10 and heat pipe 20 to the heat-dissipating block 30 for effective dissipation to the atmosphere in facility with a fan (not shown) provided in the electronic component 50.

As shown in FIG. 2, the joining portion 11 of the main body 10 is configured as a short cylinder having a central bore 111 axially connected to the interior of the main body 10, and a connecting portion 112 surrounding the central bore 111. As shown in FIG. 1, the heat pipe 20 is an elongated tube, with its first end 201 penetrating through the central. bore 111 of the joining portion 11 to be inserted into the main body 10, whereas the second end 202 of the heat pipe 20 is exposed to the exterior of the main body 10, for being fitted with the heat-dissipating block 30.

Figure 3:
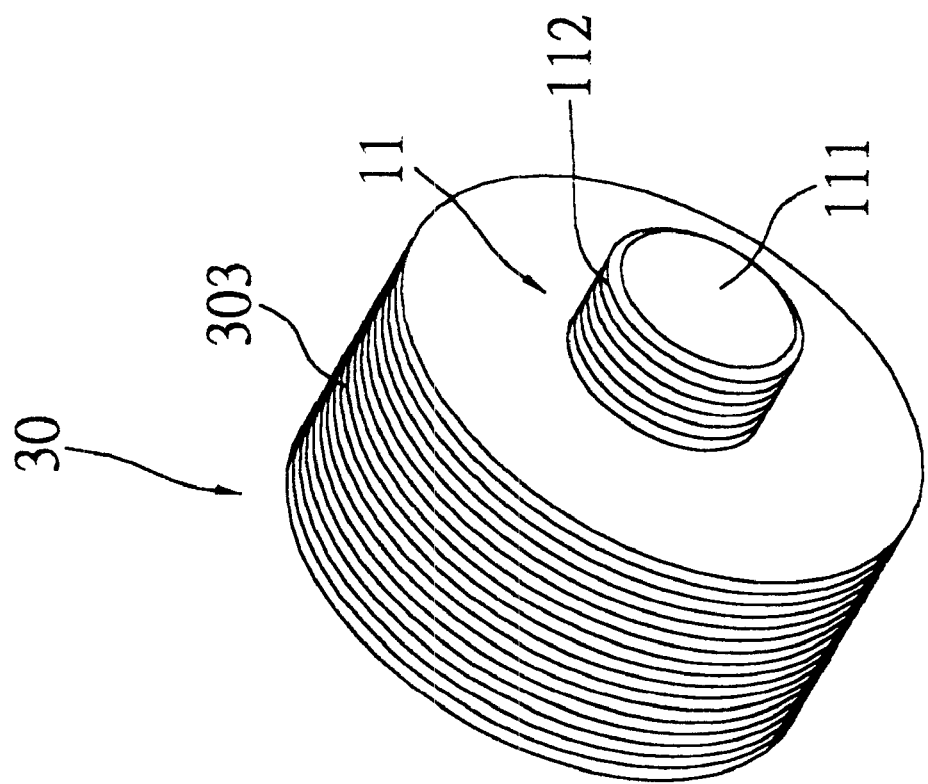
FIG. 3 is a perspective view of a heat-dissipating block of the invention.

Referring to FIGS. 3–4, the heat-dissipating block 30 is configured as a tubular body having a plurality of annular heat sinks 303 formed on a circumferential surface of the tubular body. A first connecting portion 301 is formed at one end of the tubular body, and a second connecting portion 302 dimensioned in engagement with the first connecting portion 301, is provided at the other end of the tubular body. Therefore, a plurality of heat-dissipating blocks 30 can be in series coupled to the heat pipe 20 in a manner that, a first connecting portion 301 of a heat-dissipating block 30 is engaged with a second connecting portion 302 of an adjacent heat-dissipating block 30. It is understood that, the connection between adjacent heat-dissipating blocks can be achieved by adopting any conventional connection means; nevertheless, it is preferred that the heat-dissipating blocks are attached to each other by means of threads formed at the connecting portions, so as to optimize the heat transfer area and heat dissipation efficiency.

Furthermore, the heat sinks 303 formed on the heat-dissipating block 30 are not limited to particular shape, number and extension direction as shown in the drawing. For example, the heat sinks 303 can be configured as fin or radiating shape, as long as the configuration is capable of enlarging the heat transfer area as desired in the invention.

Referring back to FIG. 1 with three heat-dissipating blocks 30 coupled to the heat pipe 20 as illustrated, a heat-dissipating block 30 positioned closest to the main body 10 has its second connecting portion 302 threadedly joined with the connecting portion 112 of the main body 10; whereas a heat-dissipating block 30 located farthest from the main body 10 has its first connecting portion 301 threadedly engaged with a threaded portion 701 of a nut 70. The nut 70 is then fixed by using a shoe 80, so as to firmly hold the heat-dissipating blocks 30 coupled to the heat pipe 20 in position.

Furthermore, as shown in FIG. 2, the number of the joining portion 11 formed on the main body 10 is not limited to one, but can be more as necessary. Also, the length and number of the heat pipe 20, and the number of the heat-dissipating block 30 coupled to the heat pipe 20, are not particularly restricted. Besides straight tube structure, the heat pipe 20 can be designed in other shapes, for example, a tube bent by 45, 90 or other degrees. It is understood that, the foregoing elements can be flexible in arrangement and design so as to be properly incorporated with a computer or server, and to optimize the effectiveness of heat dissipation.

Figure 5:
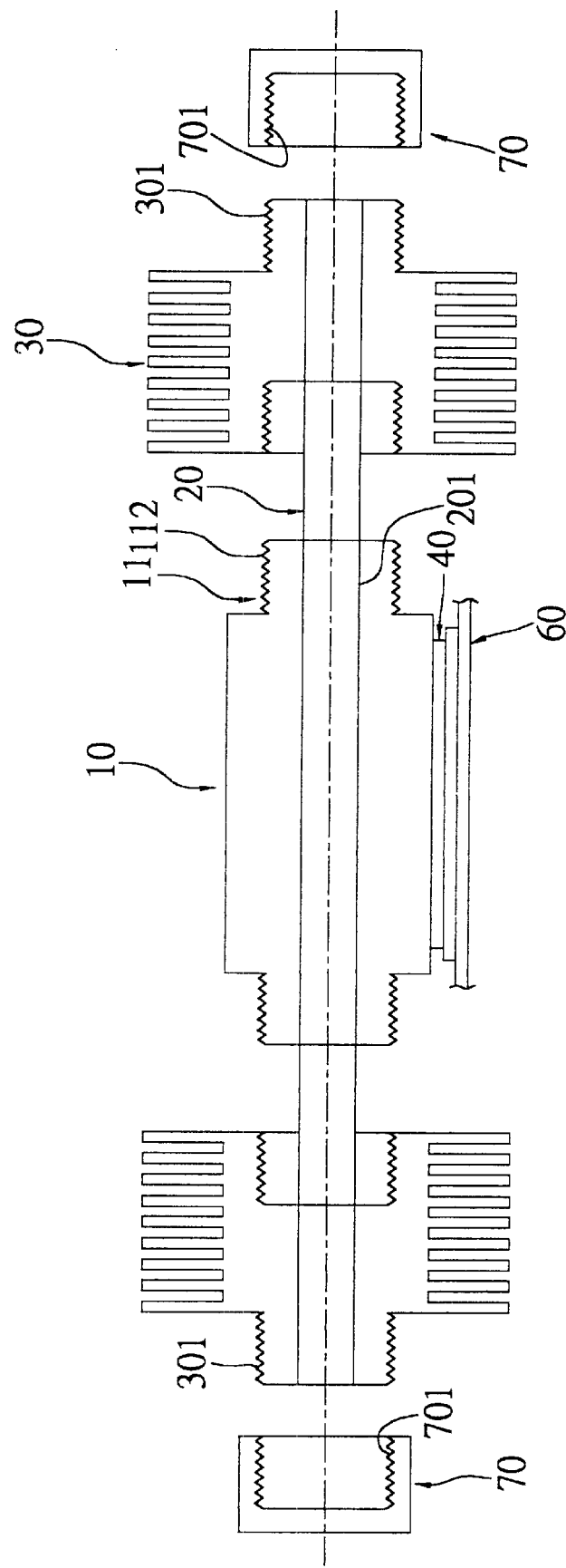
FIG. 5 is a perspective view of a heat-dissipating device of another preferred embodiment of the invention.

FIG. 5 illustrates a heat-dissipating device of another preferred embodiment of the invention. The heat-dissipating device of this embodiment is approximately identical in structure to that of the foregoing embodiment. The only difference is that, the central bore 111 of the joining portion 11 can be made to penetrate the main body 10, allowing the heat pipe 10, that is inserted into the main body 10 through the central bores 111, to expose its both ends to the exterior of the main body 10, so as to provide more flexibility of element arrangement on the motherboard 60.

Alternatively, besides insertion of the heat pipe 20 into the main body 10, the heat pipe 20 can be integrally formed with the main body 10 at one side or two opposite sides of the main body 10. In combination of any arrangement and design of the main body 10 incorporated with the heat pipe 20, the heat-dissipating device of the invention can be suitably applied to various electronic components, especially to a computer or server demanding for high efficacy of heat dissipation.

In conclusion, the invention has the following advantages over the prior art. First, multiple heat-dissipating blocks connected in series with one another, can enlarge the heat transfer area to provide sufficient heat dissipation for upgraded electronic components, without the need of developing new heat dissipation modules, thereby saving manufacturing costs as desired for economic principles. Further, no manufacture of new heat dissipation modules also reduces environmental pollution and assures environmental protection. Moreover, the heat transfer area can be further enlarged simply by increasing the number of the heat-dissipating blocks used in the heat-dissipating device of the invention, thereby allowing heat dissipation efficiency to be desirably improved. In addition, elements of the heat-dissipating device of the invention can be arranged and designed in compliance with configuration of an electronic component where the heat-dissipating device is to be mounted; this therefore provides great flexibility in application of the heat-dissipating device, so as to fulfill the heat dissipation requirement for the electronic component.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A heat-dissipating device for an electronic component, comprising:
    a main body mounted on the electronic component, and having at least a side thereof being provided with at least a joining portion;
    at least a heat pipe connected to and protruded from the joining portion of the main body, for transferring heat generated from the electronic component; and
    at least one heat-dissipating block shaped as a tubular body having a through hole and peripherally formed with a plurality of heat sinks, and detachably coupled to the protruded heat pipe via the through hole, wherein the heat-dissipating block has a first connecting portion provided at one end of the tubular body and a second connecting portion provided at the other end of the tubular body, allowing the second connecting portion of the heat-dissipating block to be engaged with the joining portion of the main body, thereby transferring the heat from the electronic component via the heat pipe to the heat-dissipating block for heat dissipation.

2. The heat-dissipating device of claim 1, wherein the main body is provided with a plurality of legs for affixing the main body onto a motherboard.

3. The heat-dissipating device of claim 1, wherein the joining portion of the main body is configured as a short cylinder with a central bore.

4. The heat-dissipating device of claim 3, wherein the central bore is made to extend into the main body.

5. The heat-dissipating device of claim 3, wherein the central bore is made to penetrate through the main body.

6. The heat-dissipating device of claim 4, wherein one end of the heat pipe is inserted into the central bore of the joining portion, and the other end of the heat pipe is exposed outside of the main body.

7. The heat-dissipating device of claim 5, wherein the heat pipe is inserted into the central bore of the joining portion through the main body, with two ends of the heat pipe being exposed outside of the main body.

8. The heat-dissipating device of claim 1, wherein the first connecting portion of the heat-dissipating block is adapted to be engaged with a second connecting portion of another heat-dissipating block, so as to enhance heat dissipation for the electronic component.

9. A heat-dissipating device for an electronic component, comprising:
    a main body mounted on the electronic component, and having at least a side thereof being provided with at least a joining portion;
    at least a heat pipe integrally formed with and protruded from the main body, wherein the heat pipe is coaxially aligned with the joining portion of the main body, for transferring heat generated from the electronic component; and
    at least one heat-dissipating block shaped as a tubular body having a through hole and peripherally formed with a plurality of heat sinks, and detachably coupled to the heat pipe via the through hole, wherein the heat-dissipating block has a first connecting portion provided at one end of the tubular body and a second connecting portion provided at the other end of the tubular body, allowing the second connecting portion of the heat-dissipating block to be engaged with the joining portion of the main body, thereby transferring the heat from the electronic component via the heat pipe to the heat-dissipating block for heat dissipation.

10. The heat-dissipating device of claim 9, wherein the joining portion of the main body is configured as a short cylinder that is aligned coaxially with the heat pipe.

11. The heat-dissipating device of claim 9, wherein the first connecting portion of the heat-dissipating block is adapted to be engaged with a second connecting portion of another heat-dissipating block, so as to enhance heat dissipation for the electronic component.

* * * * *